(12) United States Patent
Mihara

(10) Patent No.: US 6,299,932 B1
(45) Date of Patent: Oct. 9, 2001

(54) LEAD FRAME PROCESSING METHOD AND APPARATUS

(75) Inventor: Kazuo Mihara, Yamaguchi (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/444,989

(22) Filed: Nov. 23, 1999

(30) Foreign Application Priority Data

Nov. 27, 1998 (JP) .................................................. 10-336712

(51) Int. Cl.⁷ ...................................................... B05D 1/18
(52) U.S. Cl. ........................... 427/8; 427/123; 427/430.1; 134/2
(58) Field of Search ...................... 427/8, 123, 424, 427/430.1; 134/2; 118/675, 676, 668; 205/687, 915

(56) References Cited

U.S. PATENT DOCUMENTS

| | | | |
|---|---|---|---|
| 4,917,708 | * 4/1990 | Yamaguchi et al. | 51/419 |
| 4,960,140 | * 10/1990 | Ishijima et al. | 134/31 |
| 5,460,217 | * 10/1995 | Sakurai et al. | 164/35 |
| 5,653,860 | * 8/1997 | Nicholls et al. | 205/80 |
| 5,741,988 | * 4/1998 | Kikuchi et al. | 73/865.8 |

FOREIGN PATENT DOCUMENTS

| | | |
|---|---|---|
| 53-95833 | 8/1978 | (JP) . |
| 59-231844 | * 12/1984 | (JP) . |
| 62-18442 | 4/1987 | (JP) . |
| 62-22534 | 5/1987 | (JP) . |
| 62-149898 | 9/1987 | (JP) . |
| 5-275593 | 10/1993 | (JP) . |
| 6-17290 | 1/1994 | (JP) . |
| 6-283643 | 10/1994 | (JP) . |
| 6-86673 | 11/1994 | (JP) . |
| 8-330496 | 12/1996 | (JP) . |

* cited by examiner

Primary Examiner—Shrive P. Beck
Assistant Examiner—Michael Barr
(74) Attorney, Agent, or Firm—Sughrue, Mion, Zinn, Macpeak & Seas, PLLC

(57) ABSTRACT

The lead frame processing apparatus, according to the present invention is comprised of a chemical reservoir 1, an inner chemical reservoir 3, a pump 8, and an outer chemical reservoir 2, a conveyer jig control unit 7, a control unit 6, a conveyer jig 11, a jet nozzle 5, a pump 9, and a solenoid valve 10. Wherein, the chemical reservoir 1 is stored with a chemical fluid. The conveyer jig 11 grasps a number of lined lead frames 13, passes through the outer chemical reservoir 2, and then crosses the inner chemical reservoir 3 while soaking the frames 13 with the heaped-up chemical fluid. The control unit 6 controls the operation of the pump 9, via a signal line 104, supplying pure water for the jet nozzle 5; the opening/closing operation of a solenoid valve 10, via a signal line 100; and the pumping-up operation of the pump 8, via a signal line 102. It also determines whether an error has occurred or whether a lead frame 13 has fallen into the chemical reservoir 3, by the assistance of sensors 12*a* and 12*b*.

5 Claims, 4 Drawing Sheets

LEAD FRAME PROCESSING METHOD AND APPARATUS

BACKGROUND OF THE INVENTION

1. Field of the Invention

The present invention relates to a lead frame processing method and apparatus thereof which carries out the grease removal process, electrolytic process, deoxidizing process, plating process, etc., of the lined-up strip-shaped lead frames, on each of which a semiconductor chip is mounted and then sealed by a resin into a resin body.

2. Description of the Related Art

Ordinarily, semiconductor chips with their electronic circuits are mounted on their respective strip-shaped lead frames, and then sealed with a resin. Afterwards, they are subjected to various processes such as a deburring process, an electrolytic process, and a deoxidizing process. Unlike the lead frames on each of which a semiconductor chip, etc. is not mounted, these processes need adjustments to the conveying method, the soaking method in the processing reservoir, etc.

For example, the lead frame's surface processing apparatus disclosed in the Japanese Patent Application Laid-open No. Hei 5-275593 is comprised of an endless conveyer belt, which runs in the lengthwise direction of the electrolytic process reservoir, and hinges that are fixed to several areas of the belt and clamp the edges of the respective strip-shaped lead frames onto the belt. Wherein, at one end of the electrolytic process reservoir, the first guide is fixed so as to change the horizontal sideways posture of each hinge to a vertical downward posture, whereas the second guide is fixed to the other end of the reservoir, so as to change the vertical downward posture of each hinge to a horizontal sideways posture.

In this structure, when each hinge arrives at the first guide, it clasps the forwarded lead frame, which is then moved by the conveyer belt and switched from its horizontal sideways posture to a vertical downward posture by the first guide, and then soaked in the chemical fluid, which is in the electrolytic process reservoir. Afterwards, the conveyer belt conveys the vertical postures of lead frames into the electrolytic process reservoir; thus soaking them in the chemical fluid. They then pass between two electrode plates, which are arranged in their respective places, located away from the both sides of the running lead frame and at equal distances apart; so that both sides of each lead frame can be uniformly electrolyzed or plated.

However, there are the following problems with the conventional surface-processing of the lead frames. Since the fluid surface in the electrolytic process reservoir, which soaks the lead frames, is exposed to the air, the chemical fluid lies stagnant. This causes an occurrence of difference in density between the surface and the center of the fluid. As a result, the surface of each lead frame is partially uneven. Also, when used over a long period of time, active chemical fluid is lost, which causes changes in the quality of the processed lead frames.

Furthermore, when a breakdown occurs in the apparatus, there is the problem of having to manually remove the lead frames from the electrolytic process reservoir, which then must be cleaned by another cleaning apparatus. This wastes a great deal of work.

SUMMARY OF THE INVENTION

Accordingly, the objective of the present invention is to provide a lead frame processing method and apparatus thereof, which supplies the fluid surface in the reservoir with active chemical fluid without exposing it to the open air, and which can quickly cope with a breakdown of the apparatus.

To attain the above objective, according to an aspect of the present invention, a lead frame processing apparatus is provided, comprising a lead frame processing unit, which processes a lead frame, and a spray unit, which sprays a fluid on to a lead frame when the said lead frame- processing unit halts its operation and its halted time is equal to or more than a predetermined length of time.

According to an aspect of the present invention, a lead frame processing method is provided, comprising: processing a lead frame; halting said lead frame processing based on a detection of an error; and spraying a fluid onto said lead frame.

These and other objects of the present invention will be apparent to those of skill in the art from the appended claims when read in light of the following specification and accompanying figures.

DETAILED DESCRIPTION OF THE PREFERRED EMBODIMENT

Figure 1A:
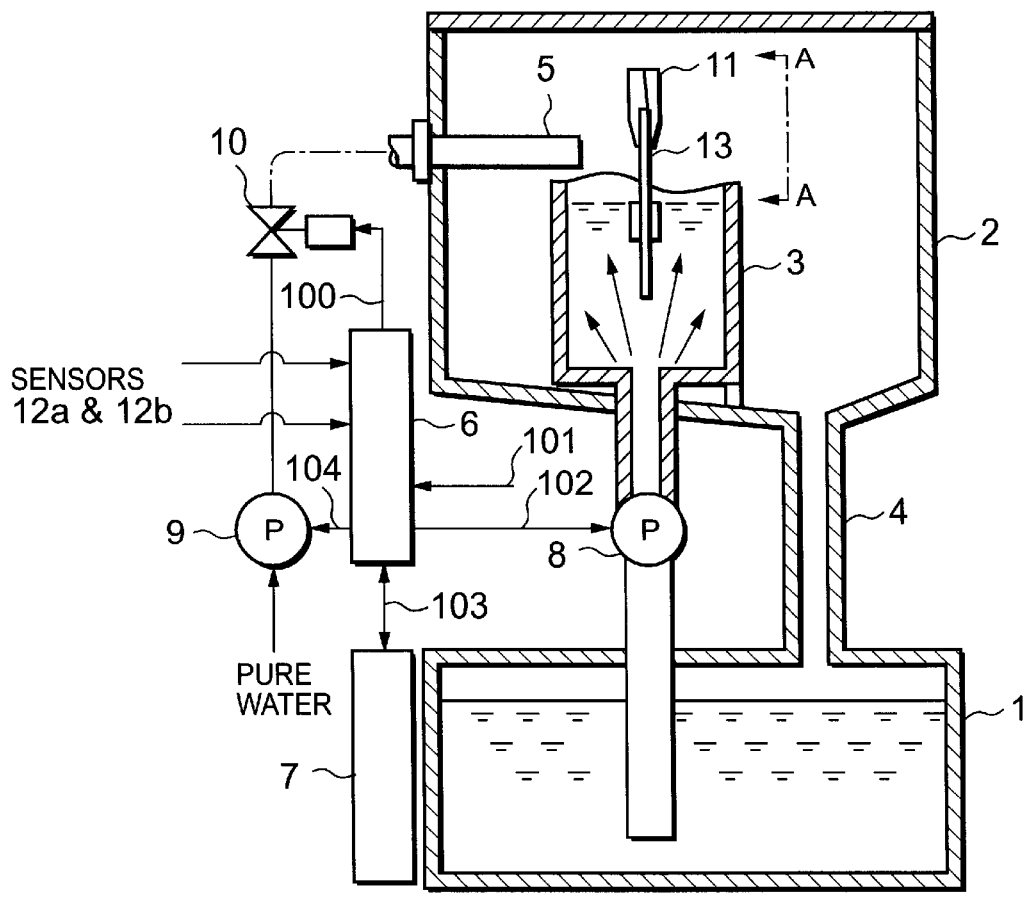
FIGS. 1A and 1B are a cross section and an illustration as viewed from arrows AA explaining a lead frame apparatus of an embodiment, according to the present invention.
Figure 1B:
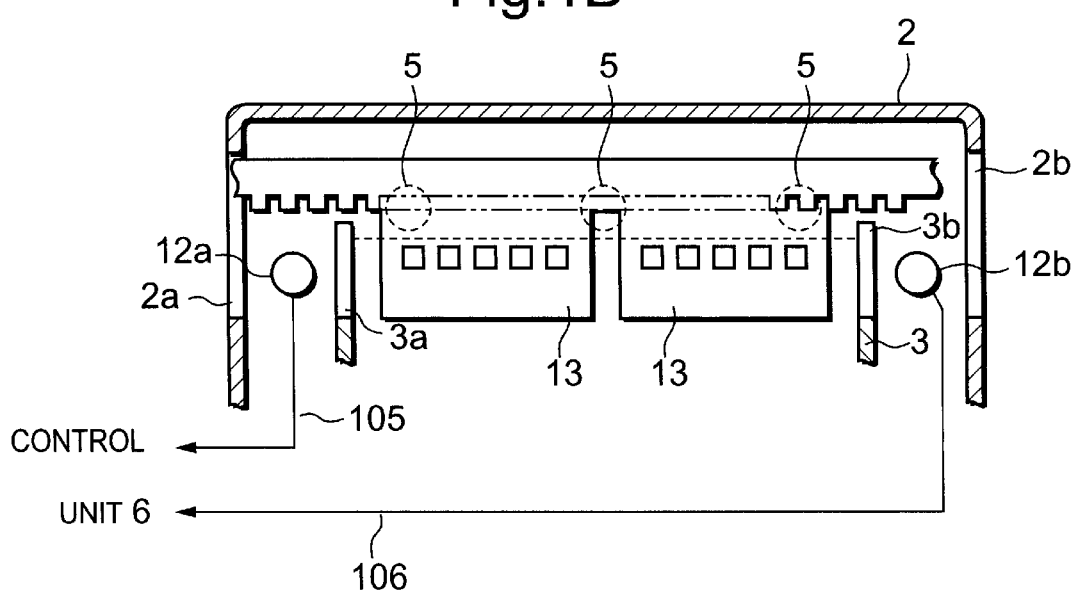

Next, the present invention will be described with reference to the drawings. FIGS. 1A and 1B are respective cross-sections of a lead frame processing apparatus of an embodiment, according to the present invention, explaining its arrangement. FIG. 1B illustrates the part as viewed from the location and direction indicated by the arrows AA in FIG. 1A. The lead frame processing apparatus, as shown in FIGS. 1A and 1B, is comprised of a chemical reservoir 1, an inner chemical reservoir 3, a pump 8, an outer chemical reservoir 2, and a conveyer jig 11. Wherein, the chemical reservoir 1 is stored with a chemical fluid. The inner chemical reservoir 3 is placed at a certain region above the chemical reservoir 1. The pump 8 pumps up the chemical fluid from the chemical reservoir 1 and then jets it out into the chemical reservoir 3, so as to heap up the surface level of the chemical fluid beyond its rim. The outer chemical reservoir 2 collects the chemical fluid, which has overflowed from the inner chemical reservoir 3; and encloses the outer surroundings, including the upper and lower surfaces of the inner chemical reservoir 3. The conveyer jig 11 grasps a number of lined lead frames 13 and enters the outer chemical reservoir 2, and then crosses to the inner chemical reservoir 3, while soaking the lead frames 13 in the over-flowed chemical fluid.

Besides this arrangement, the lead frame processing apparatus is further comprised of a conveyer jig control unit 7, which controls the carrying operation of the conveyer jig 11, and a control unit 6. The control unit 6 controls the operation of the pump 9, via a signal line 104 and supplying pure water for a jet nozzle 5; the opening/closing operation of a solenoid valve 10, via a signal line 100; and the pumping-up operation of the pump 8, via a signal line 102. It also transmits a conveyer jig start/stop requesting signal to the conveyer jig control unit 7 via a signal line 103, when it determines, based upon signals coming from sensors 12a and 12B (see FIG. 1B), that a lead frame has been detached from the conveyer belt 11 and then has fallen into the inner chemical reservoir. Moreover, the control unit 6 may receive an error signal 101 from an error detection unit (not shown in the figures). The error detection unit detects an occurrence of errors except for that of a fall of a lead frame into the inner chemical reservoir 3, which requires halting the normal operation of this lead frame processing apparatus.

Next, the operation of a plating process, etc. executed by the lead frame processing apparatus will be explained. First, the chemical reservoir 1 is filled with an organic acid, which is mixed with a dissolved solder. A loader (not shown in the figures), located before the outer chemical reservoir 2, attaches lead frames 13 one by one to the belt conveyer jig 11. The pump 8 is then activated so that the chemical fluid can be pumped from the chemical reservoir 1 up to the inner chemical reservoir 3 and that the top surface of the chemical fluid can be heaped up and can then overflow from the reservoir 3. The chemical fluid, that drips from the chemical reservoir 3, naturally falls from the bottom of the outer chemical reservoir 2 back to the chemical reservoir 1 via a pipe 4. It is noted that heaping up the chemical fluid in the inner chemical reservoir 3 allows uniform plating.

The conveyer jig 11 runs while holding the lead frames 13. As shown in FIG. 1B, the conveyer jig 11 with the lead frames 13 enters a small aperture 2a of the outer chemical reservoir 2, and passes through a slit 3a of the inner chemical reservoir 3. The lead frames 13 are then soaked in the chemical fluid. The conveyer jig 11 with the lead frames 13 then passes through a slit 3b, and the lead frames 13 exit one after another from an aperture 2b of the chemical reservoir 2. During this procedure, a sensor 12a detects whether each of the lead frames 13 has entered the outer chemical reservoir 2, whereas a sensor 12b detects whether each of the lead frames are sent out from the outer chemical reservoir 2. These sensors are not always necessary, but can very quickly detect whether one of the lead frames 13 may have become detached from the conveyer jig 11 and has fallen into the inner chemical reservoir 3. The sensors 12a and 12b are also used to activate the control unit 6 so as to calculate the number of lead frames left within the inner chemical reservoir 3. When each sensor detects a lead frame, a detection signal is sent to the control unit 6, which then conducts an internal count that shows how many numbers of lead frames have entered the outer chemical reservoir 2 (dependent upon the sensor 12a), and an internal count that shows how many numbers of lead frames have been moved out from the outer chemical reservoir 2 (dependent upon the sensor 12b). In this counting operation, if it is discovered by the control unit 6 that there is a difference between the counts corresponding to the respective sensors 12a and 12b, it means that at least one lead frame has fallen into the inner chemical reservoir 3.

In this procedure, the lead frames 13, conveyed by the conveyer jig 11, are moved out one after another from the outer chemical reservoir 2 by the help of a rotating reel (not shown in the figures). These lead frames 13 are then detached from the conveyer jig 11 at a distance away from the outer chemical reservoir 2 by an unloader (not shown in the figures). Since the belt conveyer jig 11 can consecutively convey the lead frames 13 without changing their posture, their processing time is beneficially shortened. In addition, since the inner chemical reservoir 3 is enclosed by the outer chemical reservoir 2, even if the harmful chemical fluid scatters around, there is no human bodily contact.

Figure 2A:
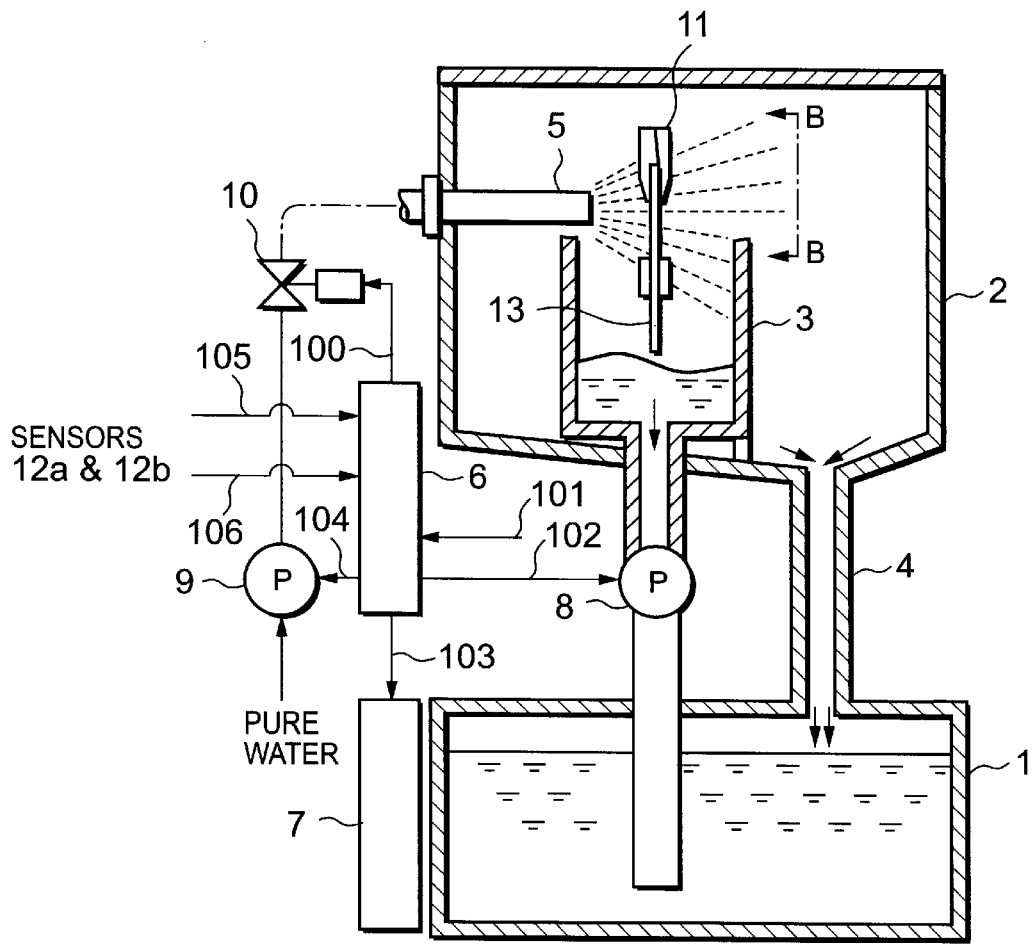
FIGS. 2A and 2B are a cross section and an illustration as viewed from arrows BB explaining how to clean lead frames as shown in FIG. 1.
Figure 2B:
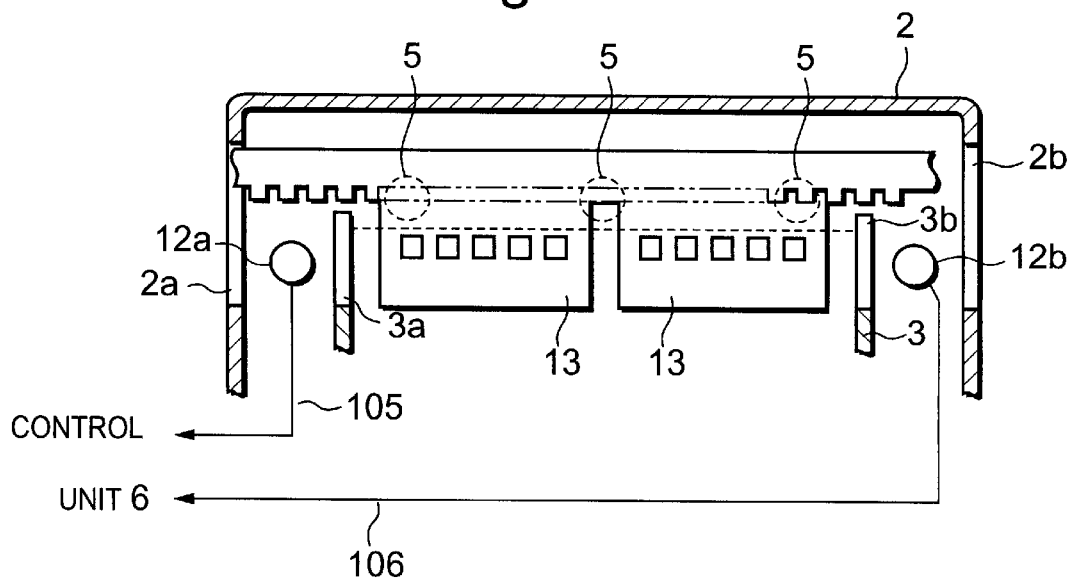
Figure 3:
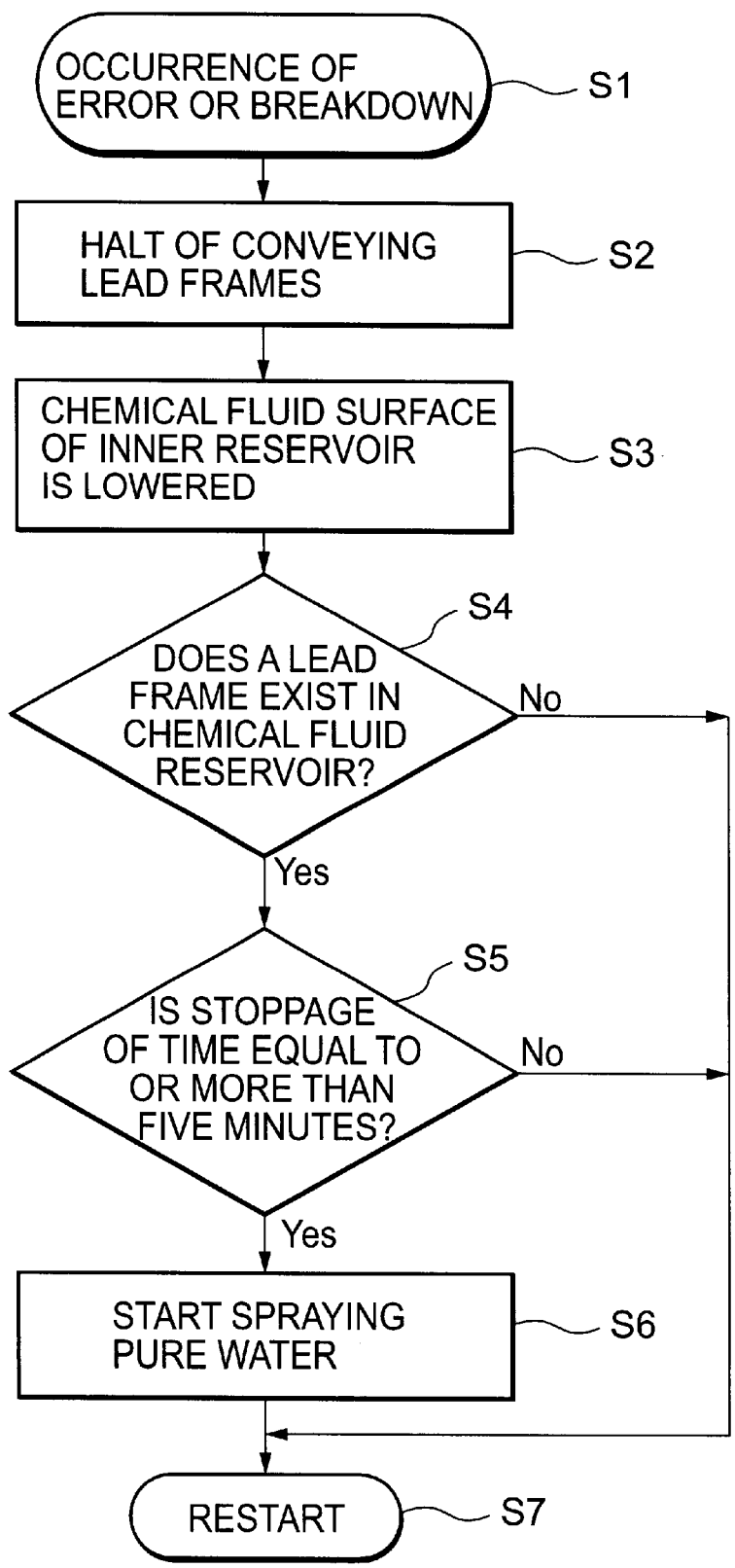
FIG. 3 is a flowchart explaining how to cope with a breakdown when it occurs.

FIGS. 2A and 2B are a cross section and a diagram as viewed from the position and direction that the arrows BB indicate, explaining a cleaning method of the lead frames 13 in FIGS. 1A and 1B. FIG. 3 is a flowchart explaining how to cope with an error if it happens. If an error occurs on the lead frame processing apparatus and thus its operation stops, fixing the trouble or cleaning the lead frames, which are left in the outer chemical reservoir 2, conventionally requires a lot of man-hours. For the purpose of solving this problem, the present invention provides a spray nozzle 5, which sprays pure water, cleaning the lead frames 13 left inside, as shown in FIG. 2.

While referring to FIG. 3, upon an occurrence of trouble, such as a lead frame having fallen into the inner chemical reservoir 3 (step S1); the control unit 6 in FIG. 2 directs the conveyer jig control unit 7 to stop the conveyer jig 11 (in step S2). At the same time, the control unit 6 stops the operation of the pump 8, thus lowering the surface level of the chemical fluid in the inner chemical reservoir 3 (in step S3). Whether or not there is a lead frame 13 left in the outer chemical reservoir 2 is then determined based upon the latest counts corresponding to the sensors 12a and 12b (in step S4). If it is determined to be yes here, how much time has passed since the conveyer jig 11 has halted, which occurred in step S2, is determined (in step S5). If the passage of time is equal to or more than five minutes, the pump 9 is allowed to start its water pumping operation and the solenoid valve 10 is simultaneously opened so as to spray pure water from the spray nozzle 5 onto the lead frames 13, thus cleaning them (in step S6). This prevents an occurrence of an oxidation and hydrogen embrittlement of the lead frames 13. Thereafter, when the trouble with the apparatus is fixed, the conveyer jig 11 is set in motion again, thus taking the cleaned lead frames 13 out from the outer chemical reservoir 2, and finally putting them back into a storage unit (not shown in the figures) of the aforementioned loader.

Getting back to Step S4, when it has been determined in this step that a lead frame 13 has not been left in the outer chemical reservoir 2; the next operation, dependent upon FIG. 3, is not performed until the trouble with apparatus is fixed. In step 5, if it is determined that the passage of time is less than five minutes; the normal operation resumes in step S7, right after the trouble with the apparatus has been fixed. It is noted that the limit for the allowable fixing time of the apparatus should be determined, as based upon the kind of chemical fluid that is to be used.

Next, the detailed configuration of the control unit 6 is described with reference to FIG. 4. Reference numeral 200 depicts a microprocessor; 201 a programmable ROM (Read Only Memory); 202 a RAM (Random Access Memory); and 204 I/O ports (Input/Output ports). The microprocessor 200 controls the entirety of the control unit 6 by reading out the program codes corresponding to the procedure as shown in the flowchart of FIG. 3, one by one, from the ROM 201, and then interpreting and executing them. The PROM 201 is stored with the program codes in advance before the operation of the control unit starts. The RAM 202 is used as a work area by the microprocessor. The I/O ports 204 are used to receive/transmit signals from/to several elements in the apparatus, via signal lines 101, 105, 106, 100, 102, 103, and 104 as described above. Each of the processing elements in the apparatus are connected to one another via control/data lines 203.

Figure 4:
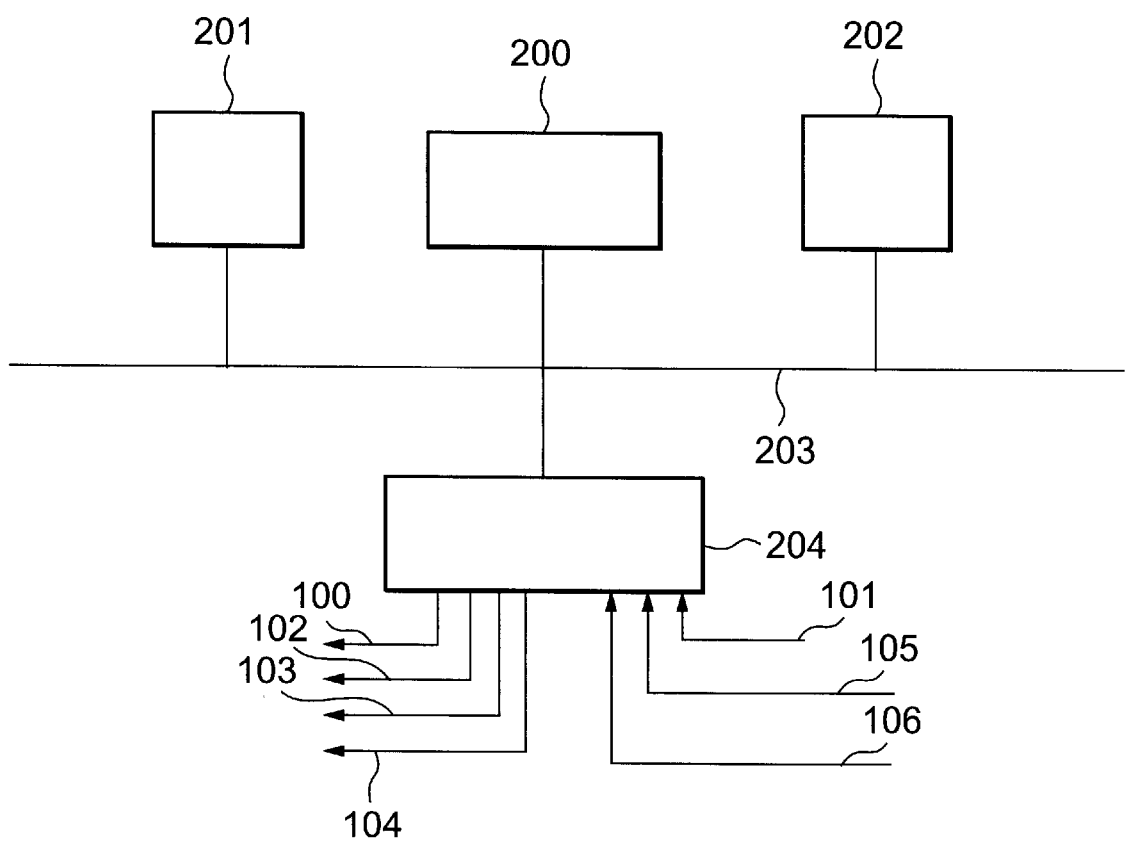
FIG. 4 illustrates the detailed configuration of a control unit 6 as shown in FIGS. 1A and 2A.

In FIG. 4, the configuration of this control unit 6 is based upon the microprocessor 200. However, the present invention is not limited to this configuration. The control unit 6 can be alternatively structured by a sequential circuit, a random logic circuit, a sequencer, etc., with each being designed to execute the procedure as shown in FIG. 3.

Results of the Invention

As described above, according to the present invention, even if an error or a breakdown occurs in the lead frame processing apparatus during its normal operation, the lead frames left inside of the chemical reservoir are cleaned by spraying pure water from the jet nozzle, without taking them out. This allows the halt time for fixing an error to be shortened and the operating ratio to be improved.

Furthermore, the same quality of processed lead frames can be provided since the lead frame processing apparatus, according to the present invention, is comprised of the chemical process reservoir (3) fixed above the chemical reservoir (1), and the pump (8) pumping the chemical fluid from the chemical reservoir (1) up to the chemical process reservoir (3), so as for the pumped-up chemical fluid to overflow and to be continuously renewed, and in this arrangement the lead frames are soaked in the chemical fluid.

Furthermore, since the lead frame processing apparatus, according to the present invention, is comprised of the outer chemical reservoir (2) enclosing the chemical process reservoir (3), the chemical fluid cannot be directly exposed to the air. This prevents an alien substance from entering the chemical fluid, thus lowering the frequency of exchanging the chemical fluid with a new one. In addition, even if the chemical fluid scatters around, there is no human bodily contact. As a result, the lead frame processing apparatus can be safely operated.

Furthermore, in the above description, whether a lead frame has fallen in the inner chemical reservoir 3 is determined by the assistance of the two sensors 12*a* and 12*b*. However, the sensor 12*a* is not always necessary. Naturally, only the sensor 12*b* can provide the control unit 6 with sufficient information for the said judgment as long as the lead frames are continually held by the conveying jig 11.

Furthermore, in the embodiment as described above, the case of plating the lead frames is in detail. However, the present invention is not limited to this operation. The lead frame processing apparatus according to the present invention can also be used to remove grease from the surface of each lead frame, electrolyze it, or deoxidize it.

A lead frame processing method and an apparatus, according to the present invention, have been described in connection with a preferred embodiment. It is to be understood that the subject matter encompassed by the present invention is not limited to that specified embodiment. On the contrary, it is intended to include all alternatives, modifications, and equivalents as can be included within the spirit and scope of the following claims.

What is claimed is:

1. A method of processing a lead frame using a chemical fluid in a chemical reservoir comprising:

(a) conveying and dipping said lead frame into said chemical fluid contained in said chemical reservoir;

(a1) detecting whether there is any trouble;

(b) halting said conveying;

(c) lowering a surface of said chemical fluid in said chemical reservoir; and (d) spraying pure water on said lead frame; wherein
   said steps (b), (c) and (d) are executed only when said trouble is detected, in said step (c) said lead frame is not submerged in said chemical fluid, and
   after said trouble is no more, step (a) is continued without taking out said lead frames from inside of said chemical reservoir during said trouble.

2. The method of claim 1, wherein step (d) is executed, only if said trouble continues more than a predetermined time.

3. The method of claim 1, further comprising providing an outer chemical reservoir that encloses said chemical reservoir to prevent exposure of the chemical fluid to the outside air.

4. A method of processing a plurality of lead frames using a chemical fluid in a chemical reservoir comprising:

(a) conveying and dipping said lead frames into said chemical fluid contained in said chemical reservoir;

(a1) detecting whether there is any trouble;

(b) halting said conveying;

(c) lowering a surface of said chemical fluid in said chemical reservoir; and (d) spraying pure water to said lead frames; wherein
   said steps (b), (c) and (d) are executed only when said trouble is detected, in said step (c) at least one of said lead frames is not submerged in said chemical fluid, and
   after said trouble is no more, step (a) is continued without taking out any of said lead frames from inside of said chemical reservoir during said trouble.

5. The method of claim 4, wherein step (d) is executed, only if at least one of said lead frames exists in said chemical reservoir and said trouble continuing over a predetermined time.

* * * * *